United States Patent
Smith

(10) Patent No.: US 7,687,893 B2
(45) Date of Patent: Mar. 30, 2010

(54) SEMICONDUCTOR PACKAGE HAVING LEADFRAME WITH EXPOSED ANCHOR PADS

(75) Inventor: Lee J. Smith, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 482 days.

(21) Appl. No.: 11/616,747

(22) Filed: Dec. 27, 2006

(65) Prior Publication Data

US 2008/0157311 A1  Jul. 3, 2008

(51) Int. Cl.
  *H01L 23/02* (2006.01)
(52) U.S. Cl. ............... 257/676; 257/666; 257/E23.031
(58) Field of Classification Search ................. 257/676, 257/666, 787, E23.061, E23.031, E23.05
  See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |

(Continued)

FOREIGN PATENT DOCUMENTS

DE  19734794 A1  8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Roy K Potter
(74) *Attorney, Agent, or Firm*—Stetina Brunda Garred & Brucker

(57) ABSTRACT

A semiconductor package including a leadframe which has one or more anchor pads formed on and/or defined by the die pad thereof. Such anchor pad(s) may be provided in any one of a multiplicity of different pad shapes, and are adapted to satisfy the required mechanical anchoring and thermal dissipation thresholds for the package, while still enabling high density circuit routing on the printed circuit board under the package. The leadframe of the semiconductor package further includes a plurality of leads which are segregated into at least two sets, with the leads of each set extending along and in spaced relation to respective ones of the peripheral edge segments defined by the die pad. Connected to the top surface of the die pad is at least one semiconductor die which is electrically connected to at least some of the leads of each set by conductive wires. The semiconductor die, the wires, and portions of the die pad and leads are encapsulated by a package body, the bottom surfaces of the anchor pads of the die pad and the bottom surfaces of the leads being exposed in or on a common exterior surface of the package body.

20 Claims, 9 Drawing Sheets

U.S. PATENT DOCUMENTS

| | | |
|---|---|---|
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorpe, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Sclesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,434,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |

| | | |
|---|---|---|
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 * | 3/2001 | Minamio et al. ............ 257/684 |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | McClellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | McClellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Vekateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijinders |
| 6,476,469 B2 | 11/2002 | Huang et al. |
| 6,476,474 B1 | 11/2002 | Hung |
| 6,482,680 B1 | 11/2002 | Khor et al. |
| 6,498,099 B1 | 12/2002 | McClellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,545,345 B1 | 4/2003 | Glenn et al. |
| 6,559,525 B2 | 5/2003 | Huang |
| 6,566,168 B2 | 5/2003 | Gang |
| 6,583,503 B2 | 6/2003 | Akram et al. |
| 6,545,332 B2 | 7/2003 | Huang |
| 6,603,196 B2 | 8/2003 | Lee et al. |
| 6,624,005 B1 | 9/2003 | DiCaprio et al. |
| 6,667,546 B2 | 12/2003 | Huang et al. |
| 7,005,327 B2 | 2/2006 | Kung et al. |
| 2001/0008305 A1 | 7/2001 | McClellan et al. |
| 2001/0044538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |
| 2004/0164387 A1 | 4/2004 | Ikenaga et al. |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |

| | | |
|---|---|---|
| JP | 6260532 | 9/1994 |
| JP | 7297344 | 11/1995 |
| JP | 7312405 | 11/1995 |
| JP | 864364 | 3/1996 |
| JP | 8083877 | 3/1996 |
| JP | 8125066 | 5/1996 |
| JP | 964284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10199934 | 7/1998 |
| JP | 10256240 | 9/1998 |
| JP | 11307675 | 11/1999 |
| JP | 00150765 | 5/2000 |
| JP | 556398 | 10/2000 |
| JP | 20010600648 | 3/2001 |
| JP | 200204397 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 0049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

SEMICONDUCTOR PACKAGE HAVING LEADFRAME WITH EXPOSED ANCHOR PADS

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a semiconductor package which includes exposed leads and one or more exposed anchor pads on the bottom surface of the package body thereof, the anchor pad(s) each being formed on and/or defined by the die pad of the semiconductor package leadframe.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body.

In the electronics industry, there is an increasing need for semiconductor packages which include leadframes adapted for large die, low input/output applications. Such leadframes typically include die pads which are sized to accommodate large semiconductor dies, and provide the requisite mechanical anchoring and thermal dissipation characteristics for the packages. In such semiconductor packages, one surface (i.e., the bottom surface) of the die pad is typically exposed within the bottom surface of the package body. However, because of the large size of the die pad and hence the large area of the exposed surface thereof, circuit routing on the underlying printed circuit board underneath the exposed die pad becomes difficult to the increased risk of shorting. In many applications, diminishing space availability increases the need to be able to accomplish high density routing on the printed circuit board under any exposed pad semiconductor packages mounted thereto.

Thus, there exists a need for large exposed pad semiconductor packages which are adapted to accommodate large semiconductor dies, yet are configured to allow for high density circuit routing under the package(s), thus improving routing flexibility on the printed circuit board to which the package(s) are surface mounted. The present invention addresses this particular need by providing a large exposed pad semiconductor package which defines one or more anchor pads formed on and/or defined by the die pad of the leadframe thereof. Such anchor pad(s) may be provided in any one of a multiplicity of different pad shapes, and are adapted to satisfy the required mechanical anchoring and thermal dissipation thresholds for the package, while still enabling high density circuit routing on the printed circuit board under the package. These, as well as other features and attributes of the present invention will be discussed in more detail below.

BRIEF SUMMARY OF THE INVENTION

In accordance with the present invention, there are provided multiple embodiments of a semiconductor package, each embodiment including a leadframe which has one or more anchor pads formed on and/or defined by the die pad thereof. Such anchor pad(s) may be provided in any one of a multiplicity of different pad shapes, and are adapted to satisfy the required mechanical anchoring and thermal dissipation thresholds for the package, while still enabling high density circuit routing on the printed circuit board under the package. The leadframe of the semiconductor package further includes a plurality of leads which are segregated into at least two sets, with the leads of each set extending along and in spaced relation to respective ones of the peripheral edge segments defined by the die pad. Connected to the top surface of the die pad is at least one semiconductor die which is electrically connected to at least some of the leads of each set by conductive wires. The semiconductor die, the wires, and portions of the die pad and leads are encapsulated by a package body, the bottom surfaces of the anchor pads of the die pad and the bottom surfaces of the leads being exposed in or on a common exterior surface of the package body.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
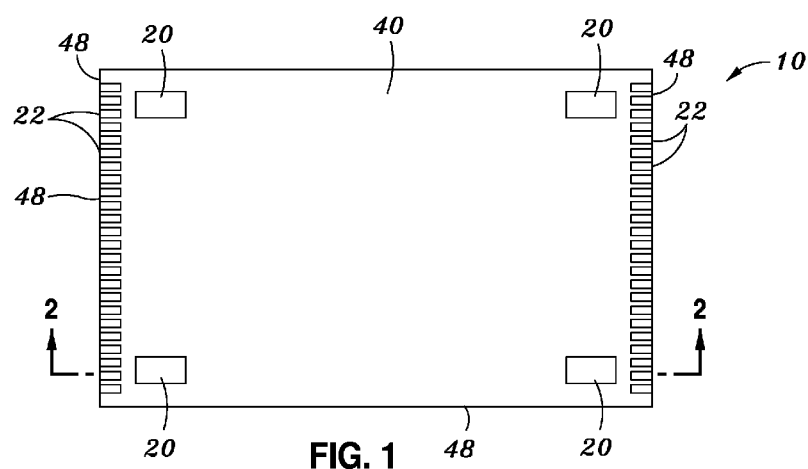
FIG. 1 is a bottom plan view of a semiconductor package constructed in accordance with a first embodiment of the present invention.
Figure 2:
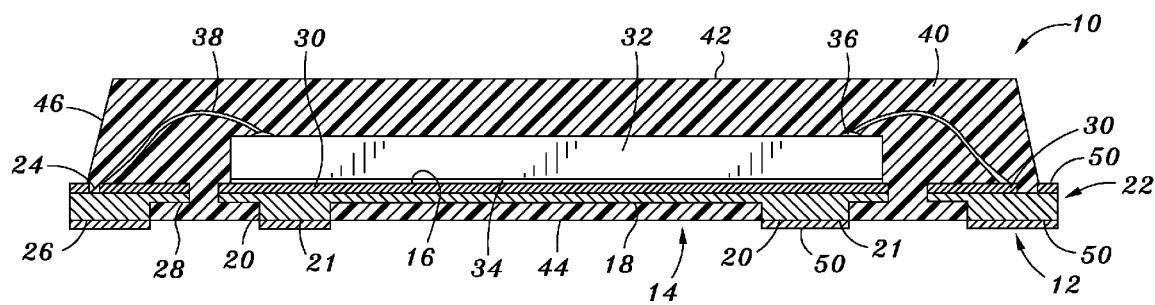
FIG. 2 is a cross-sectional view of the semiconductor package of the first embodiment of the present invention taken along line 2-2 of FIG. 1.

Referring now to the drawings wherein the showings are for purposes of illustrating various embodiments of the present invention only, and not for purposes of limiting the same, FIGS. 1 and 2 depict a semiconductor package 10 constructed in accordance with a first embodiment of the present invention. The semiconductor package 10 comprises a leadframe 12 which itself includes a die attach pad or die pad 14. In the semiconductor package 10, the die pad 14 has a generally quadrangular configuration defining four (4) peripheral edge segments. In addition, the die pad 14 defines a generally planar top surface 16, and an opposed, generally planar bottom surface 18.

The die pad 14 of the leadframe 12 further includes a plurality of anchor pads 20 which protrude downwardly from the bottom surface 18 in the manner shown in FIG. 2. As seen in FIG. 1, the die pad 14 of the semiconductor package 10 is provided with four (4) identically configured anchor pads 20, each of which has a generally quadrangular configuration and is located in close proximity to a respective one of the four corner regions defined by the die pad 14. Each anchor pad 20 defines a generally planar distal surface 21. In the leadframe 12 of the semiconductor package 10, the anchor pads 20 are preferably integral portions of the die pad 14, and are formed in a manner which will be described in more detail below.

In addition to the die pad 14, the leadframe 12 of the semiconductor package 10 comprises a plurality of leads 22. As further seen in FIG. 1, the leads 22 are segregated into two sets, with the leads 22 of each set extending along and in spaced relation to a respective one of an opposed pair of the peripheral edge segments defined by the die pad 14. Each lead 22 preferably defines a generally planar top surface 24, and a generally planar bottom surface 26 which is disposed in opposed relation to the top surface 24. In addition to the top and bottom surfaces 24, 26, each lead 22 further defines a shoulder or shelf 28 which is recessed relative to the bottom surface 26, and extends in opposed relation to the top surface 24. The shelf 28 of each lead 22 also extends to the innermost end thereof, i.e., the end disposed closest to the die pad 14.

The leadframe 12 of the semiconductor package 10 is preferably fabricated from a conventional metal material, such as copper or copper alloy. The formation of the shelves 28 within the leads 22 and the formation of the anchor pads 20 upon the bottom surface 18 of the die pad 14 are preferably facilitated by subjecting a metal plate from which the leadframe 12 is typically formed to a partial etching process. More particularly, one of the opposed, generally planar faces or sides of such metal plate preferably has an etch mask applied thereto in a manner wherein the subsequent application of a suitable etchant to the same side of the metal plate will effectively remove metal material therefrom as facilitates the formation of the bottom surface 18 of the die pad 14, as well as the recessed shelves 28 of the leads 22. Such etching process may also be used to facilitate the formation of the die pad 14 and leads 22 themselves from the original metal plate, or may be implemented so as to facilitate the formation of the bottom surface 18 (and hence the anchor pads 20) and shelves 28 subsequent to the die pad 14 and leads 22 being defined by the completion of a stamping process upon the original metal plate. As an alternative to the use of any etching process, it is also contemplated that the leadframe 12 may be formed from the completion of a two-step stamping process.

As is further seen in FIG. 2, the partial etching process to which the die pad 14 and leads 22 are subjected is preferably completed in a manner wherein the thickness of the die pad 14 between the top and bottom surfaces 16, 18 thereof is approximately one-third of the thickness of the die pad 14 between the top surface 16 and the distal surfaces 21 of the anchor pads 20 thereof. Similarly, the thickness of each lead 22 between the top surface 24 and the shelf 28 thereof is approximately one-third of the thickness of each lead 22 between the top and bottom surfaces 24, 26 thereof. Thus, in the leadframe 12, the top surfaces 16, 24 of the die pad 14 and leads 22 extend in generally co-planar relation to each other, as do the bottom surfaces 26 of the leads 22 and the distal surfaces 21 of the anchor pads 20. Though the bottom surface 18 of the die pad 14 and the shelves 28 of the leads 22 are typically not perfectly planar due to their formation as a result of the completion of a chemical etching process, such surfaces also extend in generally co-planar relation to each other in the manner shown in FIG. 2.

In the semiconductor package 10, at least a portion of the top surface 16 of the die pad 14 and at least a portion of the top surface 24 of each of the leads 22 includes a plating layer 30 applied thereto. It is contemplated that each plating layer 30 will be fabricated from a suitable conductive material. Attached to the top surface 16 of the die pad 14, and in particular to the plating layer 30 applied thereto, is a semiconductor die 32 of the semiconductor package 10. The attachment of the semiconductor die 32 to the plating layer 30 applied to the top surface 16 of the die pad 14 is preferably facilitated by a layer 34 of a suitable die attachment material. Those of ordinary skill in the art will recognize that the top surface 16 of the die pad 14 need not necessarily be provided with the corresponding plating layer 30, and that the bottom surface of the semiconductor die 32 may be attached directly to the top surface 16 of the die pad 14.

Disposed on the top surface of the semiconductor die 32 which is opposite the bottom surface adhered to the layer 34 is a plurality of terminals 36. In the semiconductor package 10, each of the terminals 36 is preferably electrically connected to a respective one of the leads 22 by a conductive wire 38. More particularly, as seen in FIG. 2, each wire 38 preferably extends between each terminal 36 and the plating layer 30 disposed on the top surface 24 of a respective one of the leads 22. The conductive wires 38 may be fabricated from aluminum, copper, gold, silver or a functional equivalent.

In the semiconductor package 10, the semiconductor die 32, wires 38, and portions of the die pad 14 and leads 22 are encapsulated or covered by an encapsulant material which, upon hardening, forms a package body 40 of the semiconductor package 10. As seen in FIG. 1, like the die pad 14, the package body 40 also preferably has a generally quadrangular configuration. The fully formed package body 40 preferably defines a generally planar top surface 42, and an opposed, generally planar bottom surface 44. In addition to the top and bottom surfaces 42, 44, the package body 40 also defines multiple side surfaces 46, each of which is preferably sloped or flared outwardly relative to the top surface 42. As seen in FIG. 2, the package body 40 is preferably formed such that outer portions of the top surfaces 24 of the leads 22 of each set project or protrude outwardly from respective ones of an opposed pair of the side surfaces 46. In this regard, in the package body 40, the side surfaces 46 preferably transition to a generally planar shoulder which extends in generally co-planar relation to the top surfaces 24 of the leads 22 (i.e., the outermost, distal portions of the top surfaces 24 of the leads 22 are exposed in and substantially flush with the shoulder defined by the package body 40). The shoulder of the package body 40 itself transitions into four peripheral edge segments 48 of the package body 40. As seen in FIG. 1, the outer, distal ends of the leads 22 of each set preferably extend in generally co-planar relation to respective ones of an opposed pair of the peripheral edge segments 48 defined by the package body 40. Those of ordinary skill in the art will recognize that as an alternative to being formed to include the sloped side surfaces 46, the package body 40 may be formed so as to define four side surfaces which extend generally perpendicularly between the top and bottom surfaces 42, 44 thereof, the outermost, distal ends of the leads 22 of each set being exposed in and substantially flush with respective ones of an opposed pair of such perpendicularly extending side surfaces.

In the semiconductor package 10, the package body 40 is further formed such that the bottom surfaces 26 of the leads 22 and the distal surfaces 21 of the anchor pads 20 defined by the die pad 14 are exposed in and substantially flush with the generally planar bottom surface 44 of the package body 40. These exposed bottom surfaces 26 and distal surfaces 21 are each preferably provided with a solder plating layer 50 which is applied thereto. As further seen in FIG. 2, solder plating layers 50 may also be applied to those portions of the top surfaces 24 of the leads 22 which are not covered by the package body 40, and are exposed in the shoulder defined thereby as described above. The encapsulant material which ultimately hardens into the package body 40 under fills both the die pad 14 and the leads 22 (i.e., covers the bottom surface 18 of the die pad 14 in addition to the shelves 28 defined by the leads 22), thus effectively creating a firm mechanical interlock between the package body 40 and the die pad 14 and leads 22 embedded therein. In the completed semiconductor package 10, the anchor pads 20, and in particular the distal surfaces 21 thereof having the solder plating layers 50 applied thereto, provide a modality by which the die pad 14 of the semiconductor package 10 can be surface mounted to an underlying support structure such as a printed circuit board. In this regard, the anchor pads 20 are adapted to satisfy the required mechanical anchoring and thermal dissipation thresholds for the semiconductor package 10, yet still enable high density circuit routing on the printed circuit board under the semiconductor package 10 without the susceptibility of shorting.

As indicated above, in the semiconductor package 10 of the first embodiment, two sets of the leads 22 are provided, with the leads 22 of each set extending along respective ones of an opposed pair of the peripheral edge segments 48 defined by the package body 40. As shown in FIG. 1, twenty-four leads 22 are included in each set. However, those of ordinary skill in the art will recognize that fewer or greater than twenty-four leads 22 may be included in each set thereof without departing from the spirit and scope of the present invention. Additionally, it is further contemplated that the leads 22 may be segregated into greater or fewer than the two sets shown in FIG. 1, and may be arranged so as to extend along one or more of the peripheral edge segments 48 defined by the package body 40 in any combination.

Figure 3A:
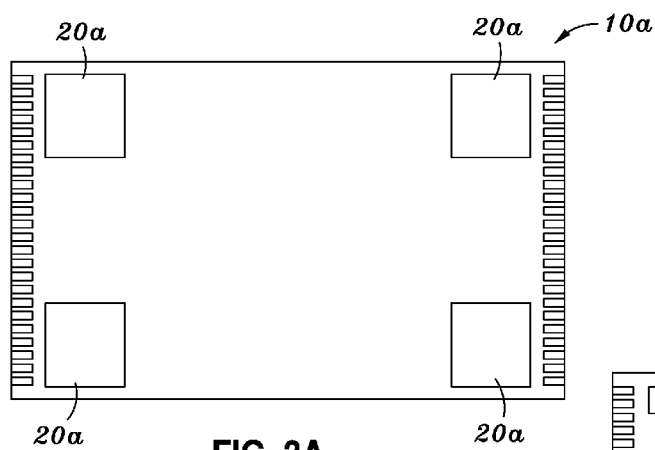
FIGS. 3A-3H are bottom plan views of variations of the semiconductor package shown in FIGS. 1 and 2.
Figure 3B:
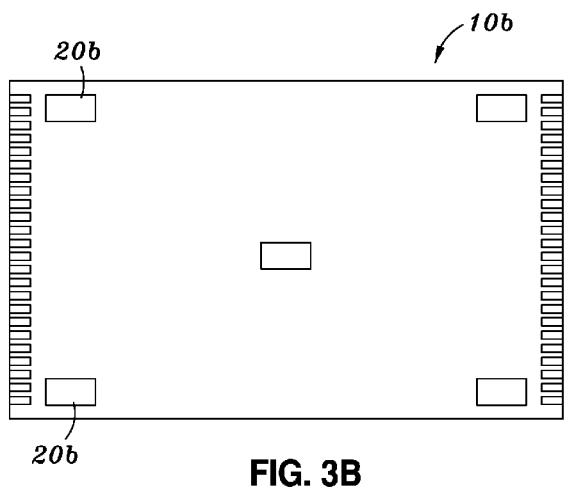
Figure 3C:
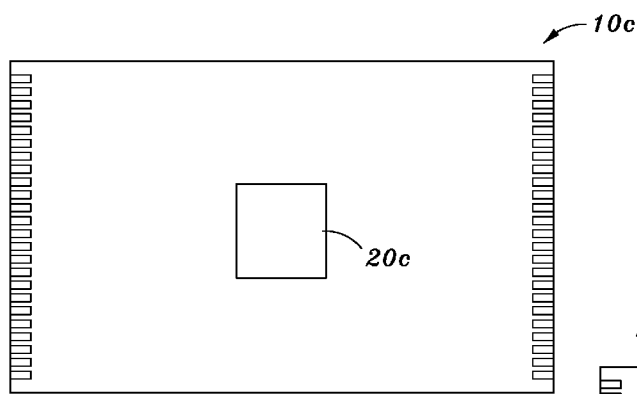

In addition to the foregoing, those of ordinary skill in the art will recognize that the semiconductor package 10, and in particular the die pad 14 of the leadframe 12 thereof, may be fabricated to include fewer or greater than the four anchor pads 20 shown in FIG. 1. Additionally, the anchor pad(s) 20 included in the die pad 14 may be provided in arrangements other than that shown in FIG. 1, or in shapes other than for the generally rectangular configuration of each anchor pad 20 as also shown in FIG. 1. For example, FIG. 3A depicts a semiconductor package 10a which includes four anchor pads 20a arranged in the same pattern as the four anchor pads 20 shown in FIG. 1, with the sole distinctions between the semiconductor packages 10, 10A being that each of the anchor pads 20a is provided in a square as opposed to a rectangular configuration, and in a larger size, i.e., the area of the distal surface of each anchor pad 20a exceeds the area of the distal surface 21 of each anchor pad 20. FIG. 3B depicts a semiconductor package 10b which includes five anchor pads 20b in comparison to the four anchor pads 20 shown in FIG. 1. In the semiconductor package 10b, four of the anchor pads 20b, which are the same sizes as the anchor pads 20, are arranged to be in close proximity to respective corners of the die pad 14, and thus are provided in the same arrangement as the anchor pads 20 shown in FIG. 1 for the semiconductor package 10. The fifth anchor pad 20b of the semiconductor package 10b is located in the approximate center of the bottom surface 18 of the die pad 14 of the semiconductor package 10b, such central anchor pad 20b thus being equidistantly spaced from the remaining four anchor pads 20b. FIG. 3C depicts a semiconductor package 10c wherein the four anchor pads 20 of the semiconductor package 10 shown in FIG. 1 are substituted with a single anchor pad 20c located in the approximate center of the lower surface 18 of the die pad 14 of the semiconductor package 10c.

Figure 3D:
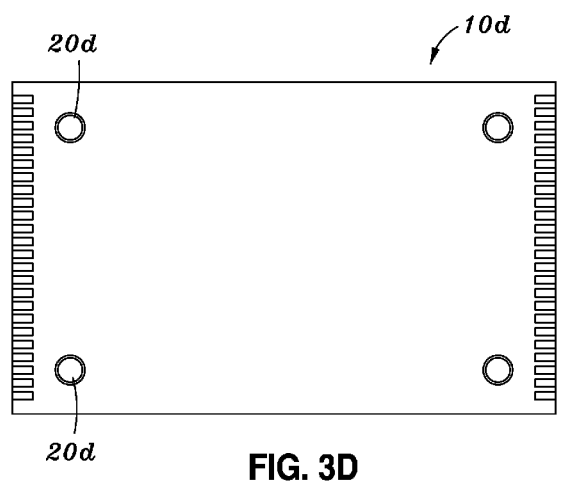
Figures 3E, 3F:
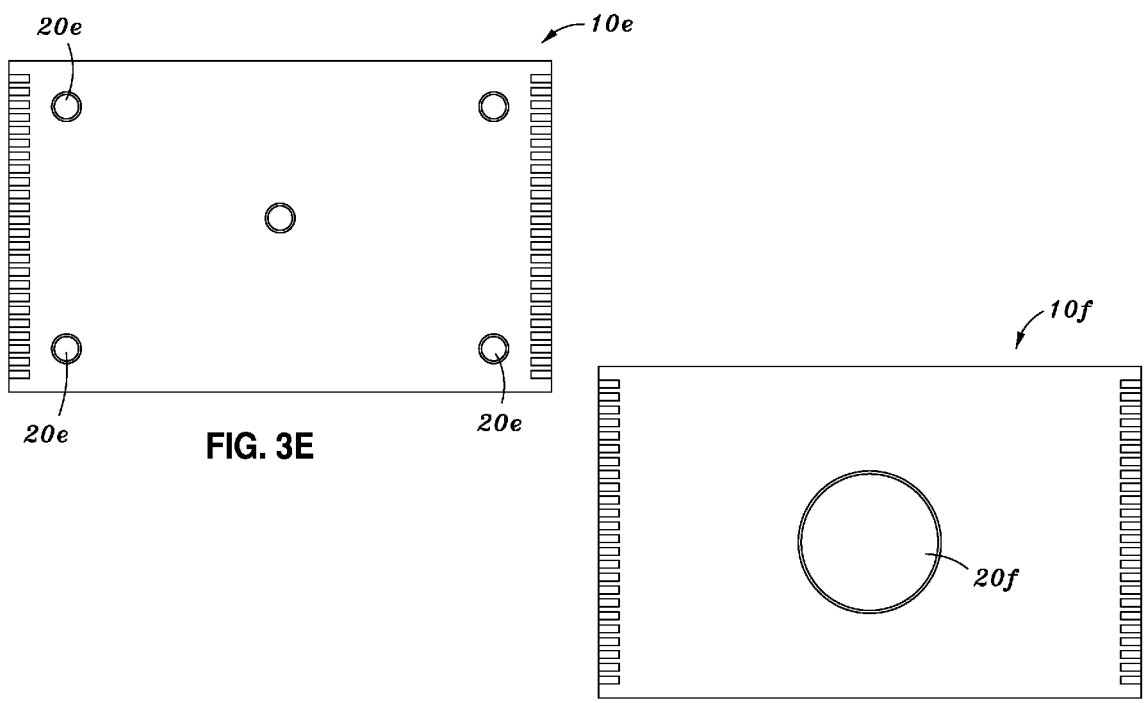

FIG. 3D depicts a semiconductor package 10d which is substantially similar to the semiconductor package 10 shown in FIG. 1, except that each of the anchor pads 20d of the semiconductor package 10d is circularly configured, as opposed to having the quadrangular configurations of the anchor pads 20. Along these lines, FIG. 3E depicts a semiconductor package 10e which is substantially similar to the semiconductor package 10b shown in FIG. 3B, the distinction being that the five generally quadrangular anchor pads 20b of the semiconductor package 10b are substituted with circularly configured anchor pads 20e in the semiconductor package 10e. FIG. 3F depicts a semiconductor package 10f which is substantially similar to the semiconductor package 10c shown in FIG. 3C, the distinction lying in the substitution of the quadrangular anchor pad 20c of the semiconductor package 10c with an oval-shaped, centrally positioned anchor pad 20f in the semiconductor package 10f.

Figure 3G:
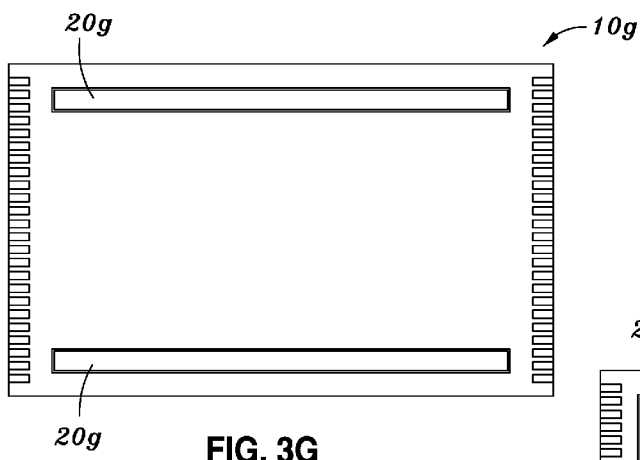
Figure 3H:
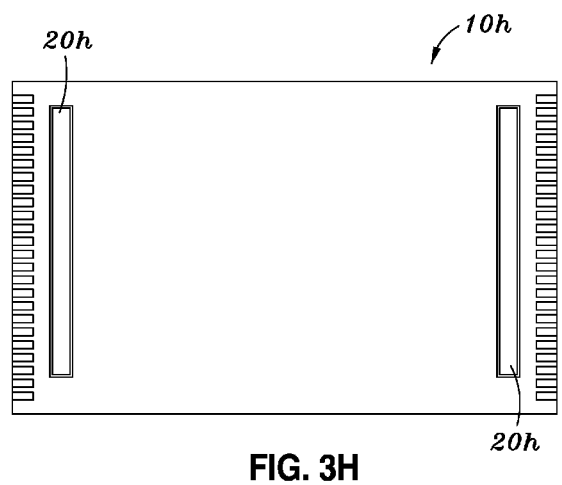

Two additional variants of the semiconductor package 10 of the present invention are shown in FIGS. 3G and 3H. FIG. 3G depicts a semiconductor package 10g wherein the four anchor pads 20 of the semiconductor package 10 shown in FIG. 1 are substituted with an opposed pair of elongate, generally rectangular anchor pads 20g. The anchor pads 20g are arranged so as to extend along and in close proximity to respective ones of the longitudinally extending sides of the generally rectangular die pad 14 integrated into the semiconductor package 10g. As a result, each of the anchor pads 20g extends generally perpendicularly between the two sets of the leads 22 included in the semiconductor package 10g, each such set of the leads 22 extending along a respective one of the opposed laterally extending peripheral edge segments 48 defined by the generally rectangular package body 40 of the semiconductor package 10g. FIG. 3H depicts a semiconductor package 10h which is similar to the semiconductor package 10g shown in FIG. 3G, except that the anchor pads 20g are substituted with anchor pads 20h which are arranged to extend along and in close proximity to respective ones of the laterally extending sides of the generally rectangular die pad 14 integrated into the semiconductor package 10h. As such, the anchor pads 20h each extend in generally parallel relation to the two sets of the leads 22 which extend along respective ones of the opposed laterally extending peripheral edge segments 48 defined by the generally rectangular package body 40 of the semiconductor package 10h.

In the semiconductor package 10 and in each variant thereof shown in FIGS. 3A-3H, it is contemplated that the area of the distal surface of the anchor pad, or the combined areas of the distal surfaces of multiple anchor pads (if included) will be less than the area of the bottom surface 18 of the die pad 14 from which the anchor pad(s) protrude. Additionally, though not shown, it is further contemplated that anchor pads of dissimilar shapes and/or sizes may be formed on a common die pad 14.

Figure 4:
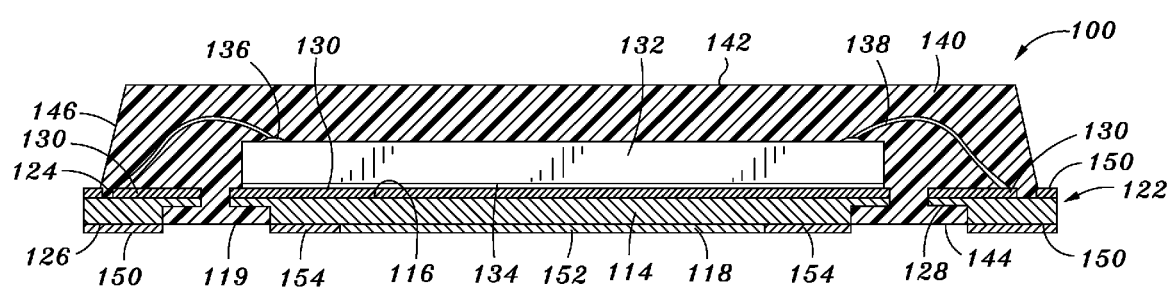
FIG. 4 is a cross-sectional view of a semiconductor package constructed in accordance with a second embodiment of the present invention.

Referring now to FIG. 4, there is shown a semiconductor package 100 constructed in accordance with a second embodiment of the present invention. The semiconductor package 100 comprises a leadframe 112 which includes a die attach pad or die pad 114. In the semiconductor package 100, the die pad 114 has a generally quadrangular configuration defining four (4) peripheral edge segments. In addition, the die pad 114 defines a generally planar top surface 116, and an opposed, generally planar bottom surface 118. In addition to the top and bottom surfaces 116, 118, the die pad 114 further defines a shoulder or shelf 119 which is recessed relative to the bottom surface 118, and extends in opposed relation to the top surface 116. The shelf 119 also preferably circumvents the bottom surface 118.

In addition to the die pad 114, the leadframe 112 of the semiconductor package 100 comprises a plurality of leads 122. As in the semiconductor package 10 described above, the leads 122 of the semiconductor package 100 are typically segregated into two sets, with the leads 122 of each set extending along and in spaced relation to a respective one of an opposed pair of the peripheral edge segments defined by the die pad 114. Each lead 122 preferably defines a generally planar top surface 124, and a generally planar bottom surface 126 which is disposed in opposed relation to the top surface 124. In addition to the top and bottom surfaces 124, 126, each lead 122 further defines a shoulder or shelf 128 which is recessed relative to the bottom surface 126, and extends in opposed relation to the top surface 124. The shelf 128 of each lead 122 also extends to the innermost end thereof, i.e., the end disposed closest to the die pad 114.

The leadframe 112 of the semiconductor package 100 is preferably fabricated from a conventional metal material, such as copper or copper alloy. The formation of the shelves 128 within the leads 122 and the formation of the shelf 119 in the die pad 114 are preferably facilitated by subjecting a metal plate from which the leadframe 112 is typically formed to a partial etching process. More particularly, one of the opposed, generally planar faces or sides of such metal plate preferably has an etch mask applied thereto in a manner wherein the subsequent application of a suitable etchant to the same side of the metal plate will effectively remove metal material therefrom as facilitates the formation of the recessed shelf 119 of the die pad 114, as well as the recessed shelves 128 of the leads 122. Such etching process may also be used to facilitate the formation of the die pad 114 and leads 122 themselves from the original metal plate, or may be implemented so as to facilitate the formation of the shelves 119, 128 subsequent to the die pad 114 and leads 122 being defined by the completion of a stamping process upon the original metal plate. As an alternative to the use of any etching process, it is also contemplated that the leadframe 112 may be formed from the completion of a two-step stamping process.

As is further seen in FIG. 4, the partial etching process to which the die pad 114 and leads 122 are subjected is preferably completed in a manner wherein the thickness of the die pad 114 between the top surface 116 and the shelf 119 thereof is approximately one-third of the thickness of the die pad 114 between the top and bottom surfaces 116, 118 thereof. Similarly, the thickness of each lead 122 between the top surface 124 and the shelf 128 thereof is approximately one-third of the thickness of each lead 122 between the top and bottom surfaces 124, 126 thereof. Thus, in the leadframe 112, the top surfaces 116, 124 of the die pad 114 and leads 122 extend in generally co-planar relation to each other, as do the bottom surfaces 118, 126 of the die pad 114 and leads 122. Though the shelves 119, 128 are typically not perfectly planar due to their formation as a result of the completion of a chemical etching process, such surfaces also extend in generally co-planar relation to each other in the manner shown in FIG. 4.

In the semiconductor package 100, at least a portion of the top surface 116 of the die pad 114 and at least a portion of the top surface 124 of each of the leads 122 includes a plating layer 130 applied thereto. It is contemplated that each plating layer 130 will be fabricated from a suitable conductive material. Attached to the top surface 116 of the die pad 114, and in particular to the plating layer 130 applied thereto, is a semiconductor die 132 of the semiconductor package 100. The attachment of the semiconductor die 132 to the plating layer 130 applied to the top surface 116 of the die pad 114 is preferably facilitated by a layer 134 of a suitable die attachment material. Those of ordinary skill in the art will recognize that the top surface 116 of the die pad 114 need not necessarily be provided with the corresponding plating layer 130, and that the bottom surface of the semiconductor die 132 may be attached directly to the top surface 116 of the die pad 114.

Disposed on the top surface of the semiconductor die 132 which is opposite the bottom surface adhered to the layer 134 is a plurality of terminals 136. In the semiconductor package 100, each of the terminals 136 is preferably electrically connected to a respective one of the leads 122 by a conductive wire 138. More particularly, as seen in FIG. 4, each wire 138 preferably extends between each terminal 136 and the plating layer 130 disposed on the top surface 124 of a respective one of the leads 122. The conductive wires 138 may be fabricated from aluminum, copper, gold, silver or a functional equivalent.

In the semiconductor package 100, the semiconductor die 132, wires 138, and portions of the die pad 114 and leads 122 are encapsulated or covered by an encapsulant material which, upon hardening, forms a package body 140 of the semiconductor package 100. Like the die pad 114, the package body 140 also preferably has a generally quadrangular configuration. The fully formed package body 140 preferably defines a generally planar top surface 142, and an opposed, generally planar bottom surface 144. In addition to the top and bottom surfaces 142, 144, the package body 140 also defines multiple side surfaces 146, each of which is preferably sloped or flared outwardly relative to the top surface 142. As seen in FIG. 4, the package body 140 is preferably formed such that outer portions of the top surfaces 124 of the leads 122 of each set project or protrude outwardly from respective ones of an opposed pair of the side surfaces 146. In this regard, in the package body 140, the side surfaces 146 preferably transition to a generally planar shoulder which extends in generally co-planar relation to the top surfaces 124 of the leads 122 (i.e., the outermost, distal portions of the top surfaces 124 of the leads 122 are exposed in and substantially flush with the shoulder defined by the package body 140). The shoulder of the package body 140 itself transitions into four peripheral edge segments of the package body 140. The outer, distal ends of the leads 122 of each set preferably extend in generally co-planar relation to respective ones of an opposed pair of the peripheral edge segments defined by the package body 140. Those of ordinary skill in the art will recognize that as an alternative to being formed to include the sloped side surfaces 146, the package body 140 may be formed so as to define four side surfaces which extend generally perpendicularly between the top and bottom surfaces 142, 144 thereof, the outermost, distal ends of the leads 122 of each set being exposed in and substantially flush with respective ones of an opposed pair of such perpendicularly extending side surfaces.

In the semiconductor package 100, the package body 140 is further formed such that the bottom surfaces 126 of the leads 122 and the bottom surface 118 of the die pad 114 are exposed in and substantially flush with the generally planar bottom surface 144 of the package body 140. The exposed bottom surfaces 126 of the leads 122 are each preferably provided with a solder plating layer 150 which is applied thereto. As further seen in FIG. 4, solder plating layers 150 may also be applied to those portions of the top surfaces 124 of the leads 122 which are not covered by the package body 140, and are exposed in the shoulder defined thereby as described above.

Subsequent to the formation of the package body 140 in the above described manner, a solder mask 152 is applied to a prescribed portion of the bottom surface 118 of the die pad 114 which is exposed in the bottom surface 144 of the package body 140 as indicated above. The solder mask 152 is applied that such that separate areas of the bottom surface 118 are not covered thereby, and thus remain exposed. Applied to each of the exposed areas of the bottom surface 118 not covered by the solder mask 152 is a solder plating layer 154, each such solder plating layer 154 defining an anchor pad of the die pad 114. In the semiconductor package 100, the exposed areas of the bottom surface 118, and hence the anchor pads defined by the solder plating layers 154 applied to the exposed areas, are provided in the same pattern shown and described above in relation to the anchor pads 20 of the semiconductor package 10. In this regard, each of the exposed areas and hence each of the solder plating layers 154 in the semiconductor package 100 is preferably formed to have a generally quadrangular configuration. Those of ordinary skill in the art will recognize that the variations in the shapes, sizes and arrangements of the anchor pads as described above in relation to FIGS. 1, 2 and 3A-3H are also applicable to the solder plating layers 154 serving as the anchor pads in the semiconductor package 100.

The encapsulant material which ultimately hardens into the package body 140 under fills both the die pad 114 and the leads 122 (i.e., covers the shelves 119, 128 defined by the die pad 114 and leads 122), thus effectively creating a firm mechanical interlock between the package body 140 and the die pad 114 and leads 122 embedded therein. In the completed semiconductor package 100, the solder plating layers 154 mimic the functionality of the above described anchor pads, and provide a modality by which the die pad 114 of the semiconductor package 100 can be surface mounted to an underlying support structure such as a printed circuit board. In this regard, the solder plating layers 154 are adapted to satisfy the required mechanical anchoring and thermal dissipation thresholds for the semiconductor package 100, with the intervening solder mask 152 enabling high density circuit routing on the printed circuit board under the semiconductor package 100 without the susceptibility of shorting.

Figure 5:
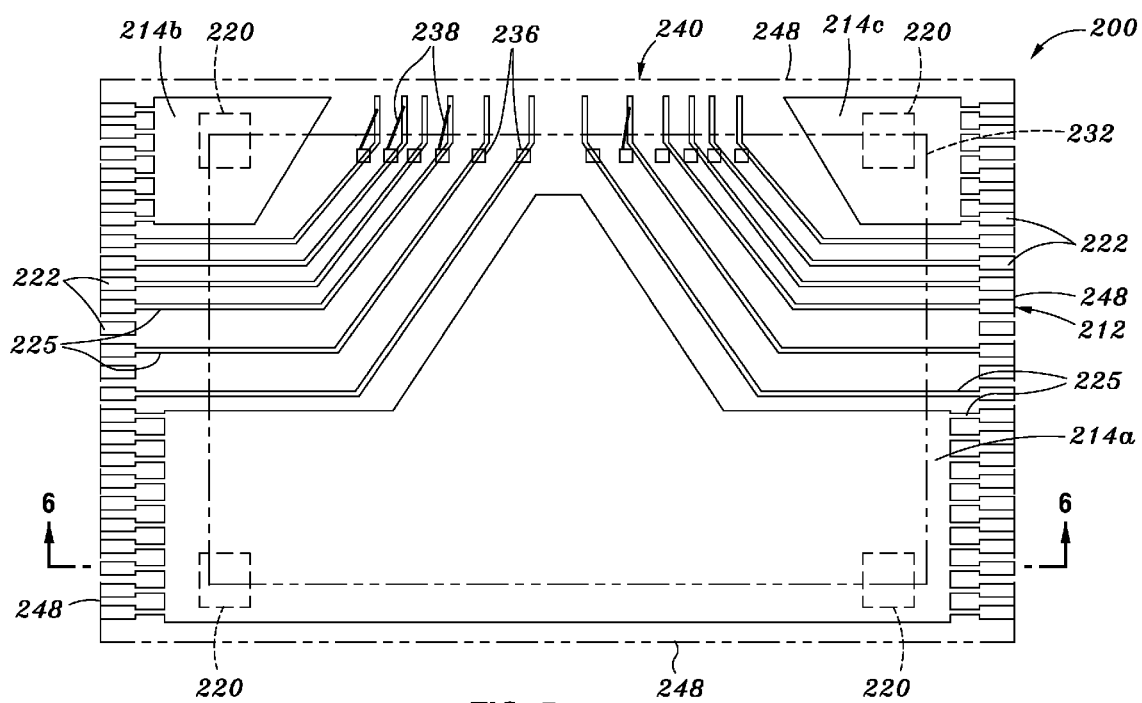
FIG. 5 is a top plan view of a semiconductor package constructed in accordance with a third embodiment of the present invention, the package body and the semiconductor die each being shown in phantom to facilitate the depiction of the leadframe thereof.
Figure 6:
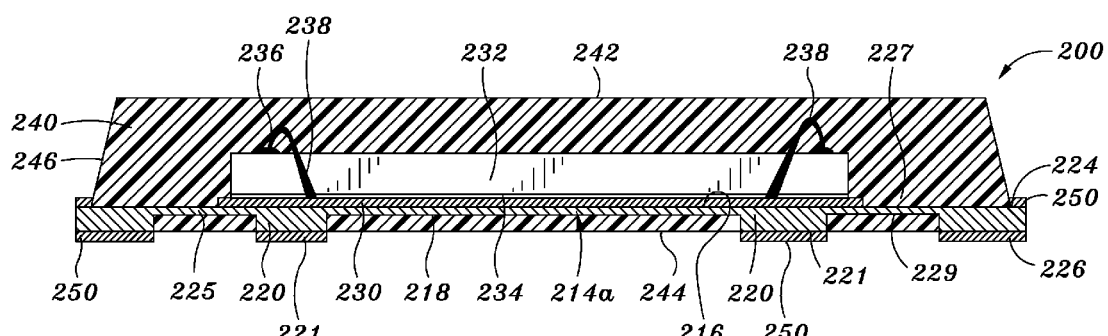
FIG. 6 is a cross-sectional view of the semiconductor package of the third embodiment of the present invention taken along line 6-6 of FIG. 5.

Referring now to FIGS. 5 and 6, there is shown a semiconductor package 200 constructed in accordance with a third embodiment of the present invention. The semiconductor package 200 comprises a leadframe 212 which itself includes a plurality of separate die attach pad sections or die pad sections 214a, 214b, 214c which are disposed in spaced relation to each other. Each of the die pad sections 214a, 214b, 214c defines a generally planar top surface 216, and an opposed, generally planar bottom surface 218. Each of the die pad sections 214a, 214b, 214c of the leadframe 212 further includes at least one anchor pad 220 which protrudes downwardly from the bottom surface 218 thereof in the manner shown in FIG. 6. As seen in FIG. 5, the die pad section 214a of the semiconductor package 200 is provided with two (2) identically configured anchor pads 220, each of which has a generally quadrangular configuration. The die pad sections 214b, 214c are each provided with one (1) anchor pad 220 which also has a generally quadrangular configuration and is identically configured to those anchor pads 220 included on the die pad section 214a. Each anchor pad 220 defines a generally planar distal surface 221. In the leadframe 212 of the semiconductor package 200, the anchor pads 220 are preferably integral portions of respective ones of the die pad sections 214a, 214b, 214c, and are formed in a manner which will be described in more detail below.

In addition to the die pad sections 214a, 214b, 214c, the leadframe 212 of the semiconductor package 200 comprises a plurality of leads 222. As further seen in FIG. 5, the leads 222 are segregated into two sets which are arranged in opposed relation to each other. Each lead 222 preferably defines a generally planar top surface 224, and a generally planar bottom surface 226 which is disposed in opposed relation to the top surface 224. The leadframe 212 also includes a plurality of elongate lead traces 225 which are integrally connected to and extend inwardly from respective ones of the leads 222. Each lead trace 225 preferably defines a generally planar top surface 227, and a generally planar bottom surface 229 which is disposed in opposed relation to the top surface 227. The bottom surfaces 229 of the traces 225 are recessed relative to the bottom surfaces 226 of the leads 222. In the leadframe 212, certain ones of the lead traces 225 extending from the leads 222 of one of the sets thereof are also integrally connected to respective ones of the die pad sections 214a, 214b. Similarly, certain ones of the lead traces 225 extending from the leads 222 of the remaining set thereof are integrally connected to the respective ones of the die pad sections 214a, 214c.

The leadframe 212 of the semiconductor package 200 is preferably fabricated from a conventional metal material, such as copper or copper alloy. The formation of the anchor pads 220 and the lead traces 225 is preferably facilitated, at least in part, by subjecting a metal plate from which the leadframe 212 is typically formed to a partial etching process. More particularly, one of the opposed, generally planar faces or sides of such metal plate preferably has an etch mask applied thereto in a manner wherein the subsequent application of a suitable etchant to the same side of the metal plate will effectively remove metal material therefrom as facilitates the formation of the bottom surface 218 of each of the die pad sections 214a, 214b, 214c, as well as the bottom surface 229 of each of the lead traces 225. Such etching process may also be used to facilitate the formation of the die pad sections 214a, 214b, 214c, leads 222 and lead traces 225 themselves from the original metal plate, or may be implemented so as to facilitate the formation of the bottom surfaces 218 (and hence the anchor pads 220) and bottom surfaces 229 subsequent to the die pad sections 214a, 214b, 214c, leads 222 and lead traces 225 being defined by the completion of a stamping process upon the original metal plate. As an alternative to the use of any etching process, it is also contemplated that the leadframe 212 may be formed from the completion of a two-step stamping process.

As is further seen in FIG. 6, the partial etching process to which the die pad sections 214a, 214b, 214c and lead traces 225 are subjected is preferably completed in a manner wherein the thickness of each of the die pad sections 214a, 214b, 214c between the top and bottom surfaces 216, 218 thereof is approximately one-third of the thickness of each of the die pad sections 214a, 214b, 214c between the top surface 216 and the distal surface(s) 221 of the anchor pad(s) 220 thereof. The thickness of each lead trace 225 between the top and bottom surfaces 227, 229 thereof is approximately one-third of the thickness of each lead 222 between the top and bottom surfaces 224, 226 thereof. In the leadframe 12, the top surfaces 216, 224, 227 of the die pad sections 214a, 214b, 214c, leads 222 and lead traces 225 extend in generally co-planar relation to each other, as do the bottom surfaces 226 of the leads 222 and the distal surfaces 221 of the anchor pads 220. Though the bottom surfaces 218 of the die pad sections 214a, 214b, 214c and the bottom surfaces 229 of the lead traces 225 are typically not perfectly planar due to their formation as a result of the completion of a chemical etching process, such surfaces also extend in generally co-planar relation to each other in the manner shown in FIG. 6.

In the semiconductor package 200, at least a portion of the top surface 216 of each of the die pad sections 214a, 214b, 214c and at least a portion of the top surface 227 of each of the lead traces 225 includes a plating layer 230 applied thereto. It is contemplated that each plating layer 230 will be fabricated from a suitable conductive material. Attached to a portion of the top surface 216 of each of the die pad sections 214a, 214b, 214c and to portions of the top surfaces 227 of at least some of the lead traces 225, and in particular to the plating layers 230 applied thereto, is a semiconductor die 232 of the semiconductor package 200. The attachment of the semiconductor die 232 to the plating layers 230 is preferably facilitated by layers 234 of a suitable die attachment material. Those of ordinary skill in the art will recognize that the top surfaces 216 of the die pad sections 214a, 214b, 214c and top surfaces 227 of the lead traces 225 need not necessarily be provided with the corresponding plating layer 230, and that the bottom surface of the semiconductor die 232 may be attached directly to the top surfaces 216 of the die pad sections 214a, 214b, 214c and the top surfaces 227 of the lead traces 225.

Disposed on the top surface of the semiconductor die 232 which is opposite the bottom surface adhered to the layers 234 is a plurality of terminals 236. In the semiconductor package 200, at least some of the terminals 236 are preferably electrically connected to respective ones of the lead traces 225 by conductive wires 238 in the manner shown in FIG. 5. Additionally, one or more of the terminals 236 may be electrically connected to one or more of the die pad sections 214a, 214b, 214c through the use of the conductive wire(s) 238. Each wire 238 preferably extends between a terminal 236 and a corresponding plating layer 230 disposed on the top surface 227 of a respective one of the lead traces 225 or the plating layer 230 disposed on the top surface 216 of a respective one of the die pad sections 214a, 214b, 214c. The conductive wires 238 may be fabricated from aluminum, copper, gold, silver or a functional equivalent.

In the semiconductor package 200, the semiconductor die 232, wires 238, lead traces 225, and portions of the die pad sections 214a, 21b, 214c and leads 222 are encapsulated or covered by an encapsulant material which, upon hardening, forms a package body 240 of the semiconductor package 200. As seen in FIG. 5, the package body 240 preferably has a generally quadrangular configuration. The fully formed package body 240 preferably defines a generally planar top surface 242, and an opposed, generally planar bottom surface 244. In addition to the top and bottom surfaces 242, 244, the package body 240 also defines multiple side surfaces 246, each of which is preferably sloped or flared outwardly relative to the top surface 242. As seen in FIG. 6, the package body 240 is preferably formed such that outer portions of the top surfaces 224 of the leads 222 of each set project or protrude outwardly from respective ones of an opposed pair of the side surfaces 246. In this regard, in the package body 240, the side surfaces 246 preferably transition to a generally planar shoulder which extends in generally co-planar relation to the top surfaces 224 of the leads 222 (i.e., the outermost, distal portions of the top surfaces 224 of the leads 222 are exposed in and substantially flush with the shoulder defined by the package body 240). The shoulder of the package body 240 itself transitions into four peripheral edge segments 248 of the package body 240. As seen in FIG. 5, the outer, distal ends of the leads 222 of each set preferably extend in generally co-planar relation to respective ones of an opposed pair of the peripheral edge segments 248 defined by the package body 240. Those of ordinary skill in the art will recognize that as an alternative to being formed to include the sloped side surfaces 246, the package body 240 may be formed so as to define four side surfaces which extend generally perpendicularly between the top and bottom surfaces 242, 244 thereof, the outermost, distal ends of the leads 222 of each set being exposed in and substantially flush with respective ones of an opposed pair of such perpendicularly extending side surfaces.

In the semiconductor package 200, the package body 240 is further formed such that the bottom surfaces 226 of the leads 222 and the distal surfaces 221 of the anchor pads 220 defined by the die pad sections 214a, 214b, 214c are exposed in and substantially flush with the generally planar bottom surface 244 of the package body 240. These exposed bottom surfaces 226 and distal surfaces 221 are each preferably provided with a solder plating layer 250 which is applied thereto. As further seen in FIG. 6, solder plating layers 250 may also be applied to those portions of the top surfaces 224 of the leads 222 which are not covered by the package body 240, and are exposed in the shoulder defined thereby as described above. The encapsulant material which ultimately hardens into the package body 240 under fills both the die pad sections 214a, 214b, 214c and the lead traces 225 (i.e., covers the bottom surfaces 218 of the die pad sections 214a, 214b, 214c in addition to the bottom surfaces 229 of the lead traces 225), thus effectively creating a firm mechanical interlock between the package body 240 and the die pad sections 214a, 214b, 214c, leads 222 and lead traces 225 embedded therein. In the completed semiconductor package 200, the anchor pads 220, and in particular the distal surfaces 221 thereof having the solder plating layers 250 applied thereto, provide a modality by which the die pad sections 214a, 214b, 214c of the semiconductor package 200 can be surface mounted to an underlying support structure such as a printed circuit board. In this regard, the anchor pads 220 are adapted to satisfy the required mechanical anchoring and thermal dissipation thresholds for the semiconductor package 200, yet still enable high density circuit routing on the printed circuit board under the semiconductor package 200 without the susceptibility of shorting.

As indicated above, in the semiconductor package 200 of the third embodiment, two sets of the leads 222 are provided, with the leads 222 of each set extending along respective ones of an opposed pair of the peripheral edge segments 248 defined by the package body 240. As shown in FIG. 5, twenty-four leads 222 are included in each set. However, those of ordinary skill in the art will recognize that fewer or greater than twenty-four leads 222 may be included in each set thereof without departing from the spirit and scope of the present invention. Additionally, it is further contemplated that the leads 222 may be segregated into greater or fewer than the two sets shown in FIG. 5, and may be arranged so as to extend along one or more of the peripheral edge segments 248 defined by the package body 240 in any combination. In addition to the foregoing, those of ordinary skill in the art will recognize that the semiconductor package 200, and in particular the die pad sections 214a, 214b, 214c of the leadframe 12 thereof, may each be fabricated to include any number of anchor pads 220, or none at all. Additionally, the anchor pad(s) 220 included in the die pad sections 214a, 214b, 214c may be provided in arrangements or locations other than that shown in FIG. 5, or in shapes other than for the generally square configuration of each anchor pad 220 as also shown in FIG. 5. In the semiconductor package 200 and in any variant thereof as described above, it is contemplated that the area of the distal surface of the anchor pad, or the combined areas of the distal surfaces of multiple anchor pads (if included) will be less than the area of the bottom surface 218 of the die pad section 214a, 214b, 214c from which the anchor pad(s) protrude. Additionally, though not shown, it is further contemplated that anchor pads of dissimilar shapes and/or sizes may be formed on a common die pad section 214a, 214b, 214c.

Figure 7:
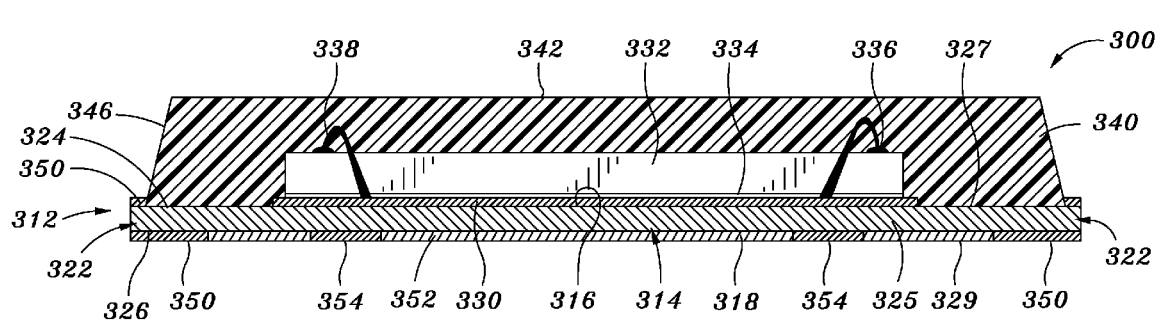
FIG. 7 is a cross-sectional view of a semiconductor package constructed in accordance with a fourth embodiment of the present invention.

Referring now to FIG. 7, there is shown a semiconductor package 300 constructed in accordance with a fourth embodiment of the present invention. The semiconductor package 300 comprises a leadframe 312 which includes a die attach pad or die pad 314 which itself includes a plurality of separate die attach pad sections or die pad sections which are substantially identical in shape and arrangement to the die pad sections 214a, 214b, 214c described above in relation to the semiconductor package 200. Each of the die pad sections of the die pad 314 defines a generally planar top surface 316, and an opposed, generally planar bottom surface 318.

In addition to the die pad sections 314, the leadframe 312 of the semiconductor package 300 comprises a plurality of leads 322. Like the leads 22, 122, 222 in the semiconductor packages 10, 100, 200, the leads 322 are preferably segregated into two sets which are arranged in opposed relation to each other. Each lead 322 preferably defines a generally planar top surface 324, and a generally planar bottom surface 326 which is disposed in opposed relation to the top surface 324. The leadframe 312 also includes a plurality of elongate lead traces 325 which are integrally connected to and extend inwardly from respective ones of the leads 322. Each lead trace 325 preferably defines a generally planar top surface 327, and a generally planar bottom surface 329 which is disposed in opposed relation to the top surface 327. As in the leadframe 212 of the semiconductor package 200, in the leadframe 312, certain ones of the lead traces 325 extending from the leads 322 of the two sets thereof are also integrally connected to respective ones of the die pad sections of the die pad 314. Additionally, in the leadframe 312, the top surfaces 316 of the die pad sections of the die pad 314, the top surfaces 324 of the leads 322, and the top surfaces 327 of the lead traces 325 extend in generally co-planar relation to each other. Similarly, the bottom surfaces 318 of the die pad sections of the die pad 314, the bottom surfaces 326 of the leads 322, and the bottom surfaces 329 of the lead traces 325 extend in generally co-planar relation to each other. However, as is shown in FIG. 5, it is contemplated that the widths of the lead traces 325 will be less than that of the leads 322. The leadframe 312 of the semiconductor package 300 is preferably fabricated from a conventional metal material, such as copper or copper alloy. It is contemplated that a stamping process or an etching process may be used to facilitate the formation of the die pad sections of the die pad 314, leads 322 and lead traces 325 from the original metal plate.

In the semiconductor package 300, at least a portion of the top surface 216 of each of the die pad sections of the die pad 314 and at least a portion of the top surface 327 of each of the lead traces 325 includes a plating layer 330 applied thereto. It is contemplated that each plating layer 330 will be fabricated from a suitable conductive material. Attached to a portion of the top surface 316 of each of the die pad sections of the die pad 314 and to portions of the top surfaces 327 of at least some of the lead traces 325, and in particular to the plating layers 330 applied thereto, is a semiconductor die 332 of the semiconductor package 300. The attachment of the semiconductor die 332 to the plating layers 330 is preferably facilitated by layers 334 of a suitable die attachment material. Those of ordinary skill in the art will recognize that the top surfaces 316 of the die pad sections of the die pad 314 and top surfaces 327 of the lead traces 325 need not necessarily be provided with the corresponding plating layer 330, and that the bottom surface of the semiconductor die 332 may be attached directly to the top surfaces 316 of the die pad sections of the die pad 314 and the top surfaces 327 of the lead traces 325.

Disposed on the top surface of the semiconductor die 332 which is opposite the bottom surface adhered to the layers 334 is a plurality of terminals 336. In the semiconductor package 300, at least some of the terminals 336 are preferably electrically connected to respective ones of the lead traces 325 by conductive wires 338 in the manner similar to that shown in FIG. 5 in relation to the semiconductor package 200. Additionally, one or more of the terminals 336 may be electrically connected to one or more of the die pad sections of the die pad 314 through the use of the conductive wire(s) 338 in the manner shown in FIG. 7. Each wire 338 preferably extends between a terminal 336 and a corresponding plating layer 330 disposed on the top surface 327 of a respective one of the lead traces 325 or the plating layer 330 disposed on the top surface 316 of a respective one of the die pad sections of the die pad 314. The conductive wires 338 may be fabricated from aluminum, copper, gold, silver or a functional equivalent.

In the semiconductor package 300, the semiconductor die 332, wires 338, lead traces 325, and portions of the die pad sections of the die pad 314 and leads 322 are encapsulated or covered by an encapsulant material which, upon hardening, forms a package body 340 of the semiconductor package 300. The package body 340 preferably has a generally quadrangular configuration which is substantially similar to that of the package body 240 shown in FIG. 5. The fully formed package body 340 preferably defines a generally planar top surface 342, and an opposed, generally planar bottom surface. In addition to the top surface 342 and the bottom surface, the package body 340 also defines multiple side surfaces 346, each of which is preferably sloped or flared outwardly relative to the top surface 342. As seen in FIG. 7, the package body 340 is preferably formed such that outer portions of the top surfaces 324 of the leads 322 of each set project or protrude outwardly from respective ones of an opposed pair of the side surfaces 346. In this regard, in the package body 340, the side surfaces 346 preferably transition to a generally planar shoulder which extends in generally co-planar relation to the top surfaces 324 of the leads 322 (i.e., the outermost, distal portions of the top surfaces 324 of the leads 322 are exposed in and substantially flush with the shoulder defined by the package body 340). The shoulder of the package body 340 itself transitions into four peripheral edge segments of the package body 340 which are substantially identical to the peripheral edge segments 248 shown and described above in relation to the package body 240 of the semiconductor package 200. The outer, distal ends of the leads 322 of each set preferably extend in generally co-planar relation to respective ones of an opposed pair of the peripheral edge segments defined by the package body 340. Those of ordinary skill in the art will recognize that as an alternative to being formed to include the sloped side surfaces 346, the package body 340 may be formed so as to define four side surfaces which extend generally perpendicularly between the top and bottom surfaces thereof, the outermost, distal ends of the leads 322 of each set being exposed in and substantially flush with respective ones of an opposed pair of such perpendicularly extending side surfaces.

In the semiconductor package 300, the package body 340 is further formed such that the bottom surfaces 326 of the leads 322, the bottom surfaces 329 of the lead traces 325, and the bottom surfaces 318 of the die pad sections of the die pad die pad 314 are exposed in and substantially flush with the generally planar bottom surface of the package body 340. The exposed bottom surfaces 326 of the leads 322 are each preferably provided with a solder plating layer 350 which is applied thereto. As further seen in FIG. 7, solder plating layers 350 may also be applied to those portions of the top surfaces 324 of the leads 322 which are not covered by the package body 340, and are exposed in the shoulder defined thereby as described above.

Subsequent to the formation of the package body 340 in the above described manner, a solder mask 352 is applied to a prescribed portions of the bottom surfaces 318 of the die pad sections of the die pad 314 which are exposed in the bottom surface of the package body 340 as indicated above. The solder mask 352 is applied that such that separate areas of the bottom surfaces 318 are not covered thereby, and thus remain exposed. Applied to each of the exposed areas of the bottom surfaces 318 not covered by the solder mask 352 is a solder plating layer 354, each such solder plating layer 354 defining an anchor pad. In the semiconductor package 300, the exposed areas of the bottom surfaces 318, and hence the anchor pads defined by the solder plating layers 354 applied to the exposed areas, are preferably provided in the same pattern shown and described above in relation to the anchor pads 220 of the semiconductor package 200. In this regard, each of the exposed areas and hence each of the solder plating layers 354 in the semiconductor package 300 is preferably formed to have a generally quadrangular configuration. Those of ordinary skill in the art will recognize that the potential variations in the shapes, sizes and arrangements of the anchor pads as described above in relation to the anchor pads 220 of the semiconductor package 200 are also applicable to the solder plating layers 354 serving as the anchor pads in the semiconductor package 300.

In the completed semiconductor package 300, the solder plating layers 354 mimic the functionality of the above described anchor pads 220, and provide a modality by which the semiconductor package 300 can be surface mounted to an underlying support structure such as a printed circuit board. In this regard, the solder plating layers 354 are adapted to satisfy the required mechanical anchoring and thermal dissipation thresholds for the semiconductor package 300, with the intervening solder mask 352 enabling high density circuit routing on the printed circuit board under the semiconductor package 300 without the susceptibility of shorting.

Figure 8:
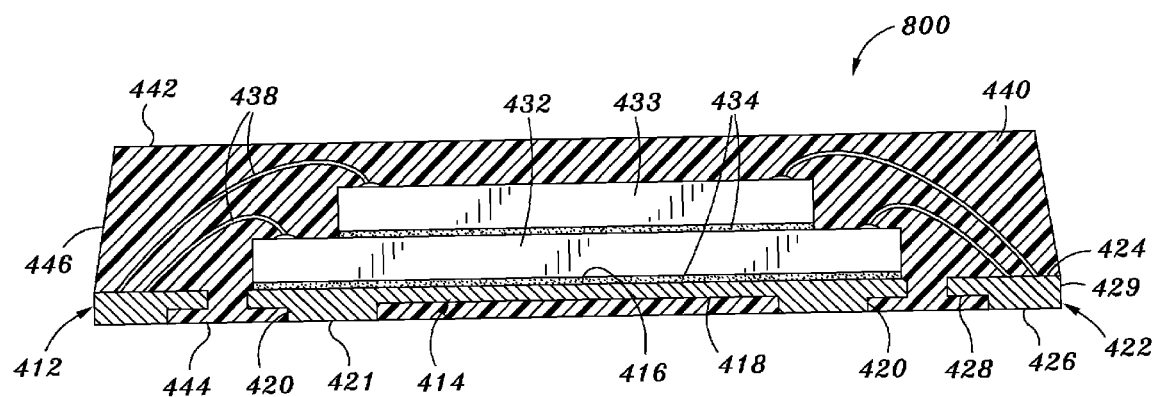
FIG. 8 is a cross-sectional view of a semiconductor package constructed in accordance with a fifth embodiment of the present invention.

Referring now to FIG. 8, there is depicted a semiconductor package 400 constructed in accordance with a fifth embodiment of the present invention. The semiconductor package 400 comprises a leadframe 412 which itself includes a die attach pad or die pad 414. In the semiconductor package 400, the die pad 414 has a generally quadrangular configuration defining four (4) peripheral edge segments. In addition, the die pad 414 defines a generally planar top surface 416, and an opposed, generally planar bottom surface 418.

The die pad 414 of the leadframe 412 further includes a plurality of anchor pads 420 which protrude downwardly from the bottom surface 418 in the manner shown in FIG. 8. The die pad 414 of the semiconductor package 400 is provided with four (4) identically configured anchor pads 420, each of which has a generally quadrangular configuration and is located in close proximity to a respective one of the four corner regions defined by the die pad 414. Each anchor pad 420 defines a generally planar distal surface 421. In the leadframe 412 of the semiconductor package 400, the anchor pads 420 are preferably integral portions of the die pad 414, and are formed in a manner which will be described in more detail below.

In addition to the die pad 414, the leadframe 412 of the semiconductor package 400 comprises a plurality of leads 422. The leads 422 are preferably segregated into two sets, with the leads 422 of each set extending along and in spaced relation to a respective one of an opposed pair of the peripheral edge segments defined by the die pad 414. Each lead 422 preferably defines a generally planar top surface 424, and a generally planar bottom surface 426 which is disposed in opposed relation to the top surface 424. In addition to the top and bottom surfaces 424, 426, each lead 422 further defines a shoulder or shelf 428 which is recessed relative to the bottom surface 426, and extends in opposed relation to the top surface 424. The shelf 428 of each lead 422 also extends to the innermost end thereof, i.e., the end disposed closest to the die pad 414.

The leadframe 412 of the semiconductor package 400 is preferably fabricated from a conventional metal material, such as copper or copper alloy. The formation of the shelves 428 within the leads 422 and the formation of the anchor pads 420 upon the bottom surface 418 of the die pad 414 are preferably facilitated by subjecting a metal plate from which the leadframe 412 is typically formed to a partial etching process. More particularly, one of the opposed, generally planar faces or sides of such metal plate preferably has an etch mask applied thereto in a manner wherein the subsequent application of a suitable etchant to the same side of the metal plate will effectively remove metal material therefrom as facilitates the formation of the bottom surface 418 of the die pad 414, as well as the recessed shelves 428 of the leads 422. Such etching process may also be used to facilitate the formation of the die pad 414 and leads 422 themselves from the original metal plate, or may be implemented so as to facilitate the formation of the bottom surface 418 (and hence the anchor pads 420) and shelves 428 subsequent to the die pad 414 and leads 422 being defined by the completion of a stamping process upon the original metal plate. As an alternative to the use of any etching process, it is also contemplated that the leadframe 412 may be formed from the completion of a two-step stamping process.

The partial etching process to which the die pad 414 and leads 422 are subjected is preferably completed in a manner wherein the thickness of the die pad 414 between the top and bottom surfaces 416, 418 thereof is approximately one-third of the thickness of the die pad 414 between the top surface 416 and the distal surfaces 421 of the anchor pads 420 thereof. Similarly, the thickness of each lead 422 between the top surface 424 and the shelf 428 thereof is approximately one-third of the thickness of each lead 422 between the top and bottom surfaces 424, 426 thereof. Thus, in the leadframe 412, the top surfaces 416, 424 of the die pad 414 and leads 422 extend in generally co-planar relation to each other, as do the bottom surfaces 426 of the leads 422 and the distal surfaces 421 of the anchor pads 420. Though the bottom surface 418 of the die pad 414 and the shelves 428 of the leads 422 are typically not perfectly planar due to their formation as a result of the completion of a chemical etching process, such surfaces also extend in generally co-planar relation to each other in the manner shown in FIG. 8.

In the semiconductor package 400, at least a portion of the top surface 416 of the die pad 414 and at least a portion of the top surface 424 of each of the leads 422 may include a plating layer applied thereto. It is contemplated that any such plating layer will be fabricated from a suitable conductive material. Attached to the top surface 416 of the die pad 414 is a first semiconductor die 432 of the semiconductor package 400. The attachment of the first semiconductor die 432 to the top surface 416 of the die pad 414 is preferably facilitated by a layer 434 of a suitable die attachment material. Attached to the top surface of the first semiconductor die 432 is a second semiconductor die 433 of the semiconductor package 400. The attachment of the second semiconductor die 433 to the top surface of the first semiconductor die 432 is also preferably facilitated by a layer 434 of a suitable die attachment material.

Disposed on the exposed top surfaces of the first and second semiconductor dies 432, 433 are a plurality of terminals. In the semiconductor package 400, each of these terminals is preferably electrically connected to a respective one of the leads 422 by a conductive wire 438. More particularly, as seen in FIG. 8, each wire 438 preferably extends between each terminal and the top surface 424 of a respective one of the leads 422. The conductive wires 438 may be fabricated from aluminum, copper, gold, silver or a functional equivalent.

In the semiconductor package 400, the first and second semiconductor dies 432, 433, wires 438, and portions of the die pad 414 and leads 422 are encapsulated or covered by an encapsulant material which, upon hardening, forms a package body 440 of the semiconductor package 400. Like the die pad 414, the package body 440 also preferably has a generally quadrangular configuration. The fully formed package body 440 preferably defines a generally planar top surface 442, and an opposed, generally planar bottom surface 444. In addition to the top and bottom surfaces 442, 444, the package body 440 also defines multiple side surfaces 446. As seen in FIG. 8, the package body 440 is preferably formed such that the outermost, distal ends 429 of the leads 422 are exposed in and substantially flush or coplanar with respective ones of an opposed pair of the side surfaces 446.

In the semiconductor package 400, the package body 440 is further formed such that the bottom surfaces 426 of the leads 422 and the distal surfaces 421 of the anchor pads 420 defined by the die pad 414 are exposed in and substantially flush with the generally planar bottom surface 444 of the package body 440. These exposed bottom surfaces 426 and distal surfaces 421 may each be provided with a solder plating layer applied thereto. The encapsulant material which ultimately hardens into the package body 440 under fills both the die pad 414 and the leads 422 (i.e., covers the bottom surface 418 of the die pad 14 in addition to the shelves 428 defined by the leads 422), thus effectively creating a firm mechanical interlock between the package body 440 and the die pad 414 and leads 422 embedded therein. In the completed semiconductor package 400, the anchor pads 420, and in particular the distal surfaces 421 thereof, provide a modality by which the die pad 414 of the semiconductor package 400 can be surface mounted to an underlying support structure such as a printed circuit board. In this regard, the anchor pads 420 are adapted to satisfy the required mechanical anchoring and thermal dissipation thresholds for the semiconductor package 400, yet still enable high density circuit routing on the printed circuit board under the semiconductor package 400 without the susceptibility of shorting.

As indicated above, in the semiconductor package 400, two sets of the leads 422 are provided, with the leads 422 of each set extending along respective ones of an opposed pair of the side surfaces 446 defined by the package body 440. However, those of ordinary skill in the art will recognize that the leads 422 may be segregated into greater or fewer than two sets, and may be arranged so as to extend along one or more of the side surfaces 446 defined by the package body 440 in any combination. In addition to the foregoing, those of ordinary skill in the art will recognize that the semiconductor package 400, and in particular the die pad 414 of the leadframe 412 thereof, may be fabricated to include fewer or greater than the four anchor pads 420 described. Additionally, the anchor pad(s) 420 included in the die pad 414 may be provided in any one of a multiplicity of different arrangements and/or shapes without departing from the spirit and scope of the present invention. Still further, the semiconductor package 400 may be fabricated to include only the first semiconductor die 432, or more than two semiconductor dies in a stacked arrangement thereof. Along these lines, the first and second semiconductor dies 432, 433 may be disposed upon the top surface 416 of the die pad 414 in side-by-side relation to each other, as opposed being stacked in the manner shown in FIG. 8. Moreover, the electrical connection of the first semiconductor die 432 to the leads 422 may be facilitated by the use of a flip chip connection as an alternative to the use of the conductive wires 438. The use of a flip chip connection as an alternative to the use of conductive wires is also applicable to the electrical connection of the semiconductor die to the leads in the prior embodiments of the present invention described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   a die pad defining opposed top and bottom pad surfaces, and including at least one anchor pad which protrudes from the bottom pad surface and defines a distal surface, the bottom pad surface being of a first area, and the distal surface being of a second area which is less than the first area;
   a plurality of leads which each define opposed top and bottom lead surfaces and extend at least partially about the die pad in spaced relation thereto;
   at least one semiconductor die attached to the top pad surface of the die pad and electrically connected to at least one the leads; and
   a package body defining a generally planar bottom surface and multiple side surfaces, the package body at least partially encapsulating the die pad, the leads and the semiconductor die such that at least the distal surface of the anchor pad and the bottom lead surfaces of the leads are exposed in the bottom surface of the package body.

2. The semiconductor package of claim 1 wherein the anchor pad is integrally connected to the bottom pad surface.

3. The semiconductor package of claim 1 wherein the die pad includes at least two anchor pads protruding from the bottom pad surface in spaced relation to each other, the distal surfaces of the anchor pads having a combined second area which is less than the first area.

4. The semiconductor package of claim 3 wherein each of the anchor pads has a generally quadrangular configuration.

5. The semiconductor package of claim 1 wherein the die pad has a generally quadrangular configuration defining multiple peripheral edge segments, and the leads are segregated into at least two sets which extend along respective ones of at least two of the peripheral edge segments of the die pad.

6. The semiconductor package of claim 5 wherein the die pad includes four anchor pads protruding from the bottom pad surface in close proximity to respective ones of four corner regions defined by the die pad, the distal surfaces of the anchor pads having a combined second area which is less than the first area.

7. The semiconductor package of claim 1 wherein the semiconductor die is electrically connected to the leads by conductive wires which are covered by the package body.

8. The semiconductor package of claim 1 wherein the package body is formed such that portions of the top lead surfaces of the leads are exposed in the package body.

9. The semiconductor package of claim 1 wherein at least portions of the distal surface of the anchor pad, the top and bottom lead surfaces of the leads, and the top pad surface of the die pad each include a plating layer disposed thereon.

10. The semiconductor package of claim 1 wherein each of the leads further defines a lead shelf which is recessed relative to the bottom lead surface, disposed in opposed relation to the top lead surface, and extends to an inner end thereof, the lead shelf being covered by the package body.

11. The semiconductor package of claim 10 wherein the die pad further defines a pad shelf which is recessed relative to and circumvents the bottom pad surface, and is disposed in opposed relation to the top pad surface, the pad shelf being covered by the package body.

12. The semiconductor package of claim 1 wherein the die pad comprises at least two die pad sections, each of which includes at least at least one anchor pad disposed thereon.

13. The semiconductor package of claim 12 further comprising a plurality of lead traces integrally connected to and extending from respective ones of the leads, the semiconductor die being electrically connected to at least some of the lead traces.

14. The semiconductor package of claim 13 wherein at least some of the lead traces are integrally connected to respective ones of the die pad sections of the die pad.

15. A semiconductor package comprising:
  a die pad defining opposed top and bottom pad surfaces, and including at least one anchor pad which is disposed on the bottom pad surface and defines a distal surface, the bottom pad surface being of a first area, and the distal surface being of a second area which is less than the first area;
  a plurality of leads which each define opposed top and bottom lead surfaces and extend at least partially about the die pad in spaced relation thereto;
  a semiconductor die attached to the top pad surface of the die pad and electrically connected to at least one the leads; and
  a package body defining a generally planar bottom surface and multiple side surfaces, the package body at least partially encapsulating the die pad, the leads and the semiconductor die such that bottom lead surfaces of the leads and the distal surface of the anchor pad are not covered by the package body.

16. The semiconductor package of claim 15 wherein the bottom pad surface of the die pad and the bottom leads surfaces of the leads are each substantially flush with the bottom surface of the package body.

17. The semiconductor package of claim 16 further comprising a solder mask disposed on and covering bottom pad surface of the die pad.

18. The semiconductor package of claim 15 wherein the die pad includes at least two anchor pads protruding from the bottom pad surface in spaced relation to each, the distal surfaces of the anchor pads having a combined second area which is less than the first area.

19. The semiconductor package of claim 15 wherein the die pad comprises at least two die pad sections, each of which includes at least at least one anchor pad disposed thereon.

20. A semiconductor package comprising:
  a die pad defining opposed top and bottom pad surfaces, and including a means for anchoring the die pad to an underlying support structure, the bottom pad surface being of a first area, and the anchoring means defining an anchoring surface which is of a second area less than the first area;
  a plurality of leads which each define opposed top and bottom lead surfaces and extend at least partially about the die pad in spaced relation thereto;
  a semiconductor die attached to the top pad surface of the die pad and electrically connected to at least one the leads; and
  a package body defining a generally planar bottom surface and multiple side surfaces, the package body at least partially encapsulating the die pad, the leads and the semiconductor die such that at least the anchoring surface of the anchor means and the bottom lead surfaces of the leads are not covered by the package body.

* * * * *